US011619657B2

(12) United States Patent
Knierim et al.

(10) Patent No.: US 11,619,657 B2
(45) Date of Patent: Apr. 4, 2023

(54) FREQUENCY CONVERTER ACCESSORY FOR A TEST AND MEASUREMENT INSTRUMENT

(71) Applicant: Tektronix, Inc., Beaverton, OR (US)

(72) Inventors: Daniel G. Knierim, Beaverton, OR (US); Josiah A. Bartlett, Forest Grove, OR (US); Amr Haj-Omar, Beaverton, OR (US); Donald J. Dalebroux, Vernonia, OR (US); Barton T. Hickman, Portland, OR (US); Alexander Krauska, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 71 days.

(21) Appl. No.: 17/099,701

(22) Filed: Nov. 16, 2020

(65) Prior Publication Data

US 2021/0148951 A1    May 20, 2021

Related U.S. Application Data

(60) Provisional application No. 62/936,339, filed on Nov. 15, 2019.

(51) Int. Cl.
*G01R 13/02* (2006.01)
*G01R 13/22* (2006.01)

(52) U.S. Cl.
CPC ........... *G01R 13/029* (2013.01); *G01R 13/22* (2013.01)

(58) Field of Classification Search
CPC .. G01R 13/029; G01R 13/0218; G01R 13/22; G01R 15/08
See application file for complete search history.

(56) References Cited

U.S. PATENT DOCUMENTS

2009/0002213 A1* 1/2009 LaMarche .......... G01R 13/0272
                                                                  341/155
2011/0002472 A1    1/2011 Quan
(Continued)

FOREIGN PATENT DOCUMENTS

KR    20120117119 A  * 10/2012  ............. G01N 29/04
KR    1020120117119     10/2012

OTHER PUBLICATIONS

Jeong Hyun Jo, Machine translation of Description of KR-20121117119-A, Oct. 2012.*

(Continued)

*Primary Examiner* — Manuel L Barbee
(74) *Attorney, Agent, or Firm* — Miller Nash LLP; Andrew J. Harrington

(57) ABSTRACT

An accessory device has a test port, an instrument port to connect to an instrument having an operating bandwidth, and one or more configurable signal paths connectable between the test port and the instrument port to convert a signal from the test port having a first frequency range to a signal having a second frequency range different than the first frequency range. A test and measurement system has a test and measurement instrument having an operating bandwidth, and an accessory device. The accessory device has a first instrument port to connect the accessory device to the test and measurement instrument, a test port to connect the accessory device to a device under test, and one or more configurable signal paths connectable between the test port and the instrument port to down-convert a signal from the test port having a first frequency range to a signal having a second frequency range lower than the first frequency range.

27 Claims, 5 Drawing Sheets

(56) References Cited

U.S. PATENT DOCUMENTS

2012/0020397 A1    1/2012  Estrada et al.
2016/0233877 A1*   8/2016  Pupalaikis ............. G01R 13/02

OTHER PUBLICATIONS

Korean Intellectual Property Office, International Search Report and Written Opinion for International Patent Application PCT/US2020/060805, dated Mar. 11, 2021, 14 pages, Daejeon, Korea.
TMYTEK, BBoxTM UD Box Datasheet, Oct. 28, 2019, 4 pages.
Keysight Technologies, E7760B with M1740A Datasheet, May 14, 2019, 9 pages, USA.

* cited by examiner

FREQUENCY CONVERTER ACCESSORY FOR A TEST AND MEASUREMENT INSTRUMENT

RELATED APPLICATIONS

This application is a continuation of, and claims priority to, U.S. Provisional Patent Application No. 62/936,339, filed Nov. 15, 2019.

FIELD

This disclosure relates to test and measurement instruments, and more particularly to test and measurement instruments in a wideband environment.

BACKGROUND

Wireless communication standards are rapidly growing in instantaneous bandwidth, allowing faster data transfer rates. As each new standard is rolled out, such as 3G, 4G, 5G, etc., bandwidth and data rates increase substantially, making it difficult for conventional test equipment to keep pace. One test solution is to use a real-time oscilloscope and software to provide very wideband spectrum analysis but the cost of this solution is high because the oscilloscope is providing bandwidth all the way from DC to the upper end of the RF band under analysis at extremely high sample rates such as 200 GS/s and higher.

Another solution is to use a spectrum analyzer. However, while spectrum analyzers generally have a tunable center frequency, they also have a relatively narrow operating bandwidth, a low sample rate, and they are expensive.

Embodiments of the disclosed apparatus and methods address shortcomings in the prior art.

DETAILED DESCRIPTION

Test and measurement equipment such as oscilloscopes, spectrum analyzers, etc. struggle to keep up with the increasing bandwidth of wireless communications while keeping costs down. Use of a real-time oscilloscope and software to provide wideband spectrum analysis has a high cost as it covers bandwidth from DC to the upper end of the RF spectrum. Another solution is to use a precision lower speed oscilloscope paired with a preceding down-converter to expand the frequency range of coverage. The down-converter/oscilloscope system may be single channel or multi-channel, and provides a cost-performance benefit of high accuracy, lower costs, and future-proof expansion of performance. The embodiments here provide a cost-effective approach by using a block down-converter in front of a slower, lower bandwidth, real-time oscilloscope or other test and measurement device, referred to here as the instrument. The instrument now need be only fast enough to capture the desired RF bandwidth plus some margin for filter skirts. The trade-off for the lower cost is the complexity of building, controlling, and calibrating the combined down-converter and oscilloscope system. Conventional solutions such as spectrum analyzers tend to be single channel with embedded digitizer sample rates $1/10^{th}$ to $1/100^{th}$ of the solution proposed here.

Figure 1:
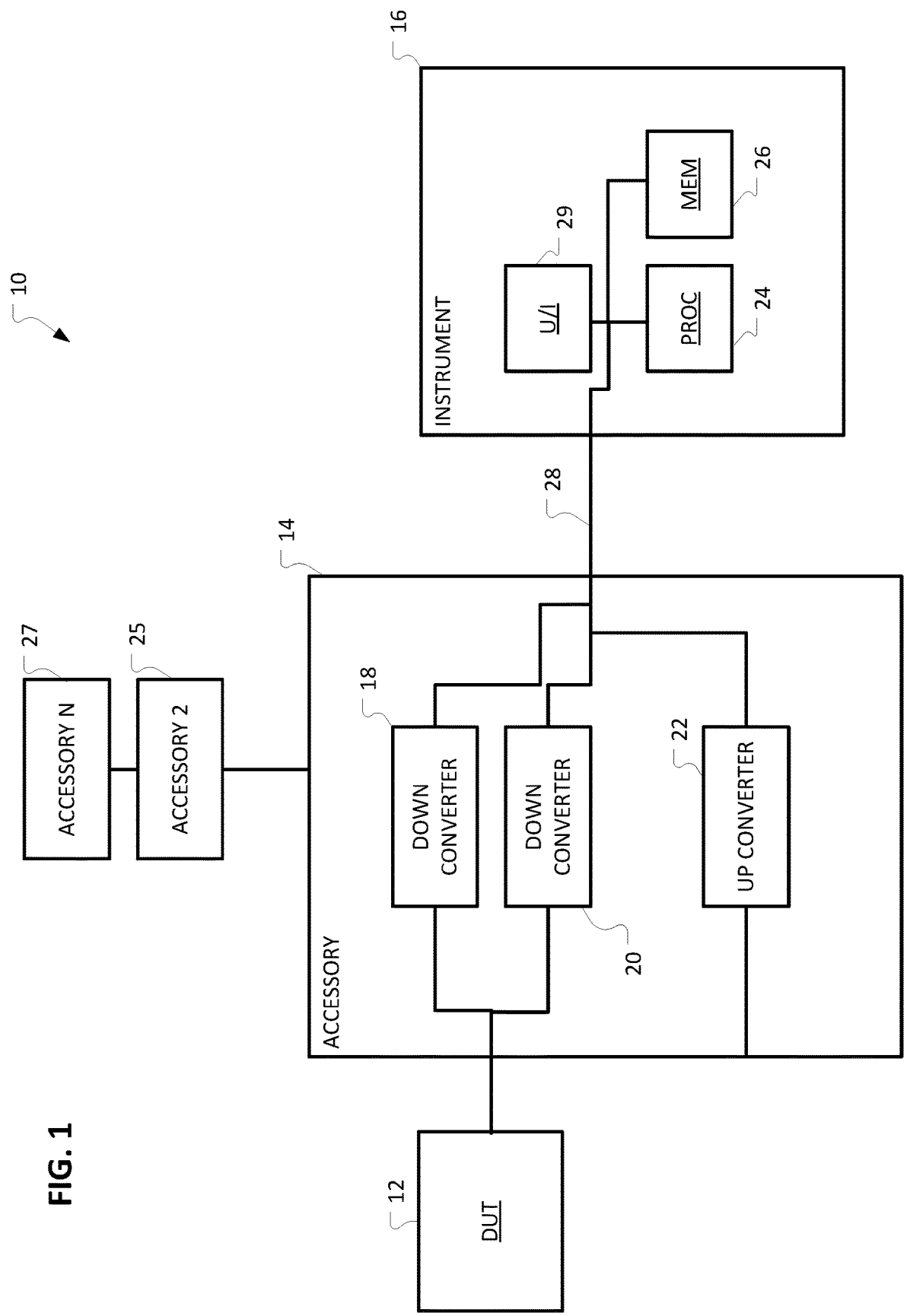
FIG. 1 shows a system diagram of test and measurement device and an accessory.

FIG. 1 shows a block diagram of a test and measurement system 10 connected to a device under test (DUT) 12. An accessory device 14 lies between the DUT 12 and the instrument 16. The accessory device 14 has at least one down-converter 18 to receive signals from the DUT across the RF spectrum and then down-convert them to a lower frequency band for analysis by the instrument 16. The test and measurement instrument 16 may be an oscilloscope, including a digital oscilloscope, and will have an operating bandwidth generally higher than other instruments, in particular, higher than a spectrum analyzer. For example, the test and measurement instrument 16 may have an operating bandwidth of at least 2, 3, 4, 5, 6, 7, or 8 GHz. In some embodiments, the test and measurement instrument 16 may be a wideband digitizer.

The accessory device 14 may have at least one additional down-converter, such as 20, that provides its output to a different channel on the instrument 16, or may provide its output to a different instrument. The accessory device 14 may also include an up-converter 22 that receives signals from the instrument, such as from a waveform generator on the instrument, or an external device and provides an up-converted signal to the DUT 12 through an output port. One of ordinary skill in the art will recognize that, in alternative embodiments, the accessory device 14 may have one or more up-conversion signal paths, instead of the down-conversion signal paths 18, 20, for selectively up-converting a signal from the DUT 12, and providing that up-converted signal to the instrument 16.

The accessory device 14 may connect to several other accessory devices such as devices 25 and 27. The connection 28 between the accessory device 14 and the instrument 16 may comprise one or more cables in which multiple signals may flow. If the connection is a cable, the accessory 14 may reside at the input end of the cable to minimize cable loss. The accessory device 14 may also connect to the instrument 16 by being mounted directly to the instrument. Many instruments may employ a standard input connector, such as BNC or N-connectors, for each input channel of the instrument. The accessory device 14 may be structured to connect to one or more of these standard connectors. Many instruments may also employ custom electro-mechanical input connectors, such as the Tektronix FlexChannel® probe interface. The accessory device 14 may be structured to connector to one or more of these custom connector types. In some embodiments, the accessory device may be housed in a test and measurement probe, such as in a probe head, and connected to the instrument by a probe cable. The accessory device 14 may receive power from the instrument 16.

The instrument 16 will typically have at least one processor 24, at least one memory 26 and a user interface (U/I) 29. The processor may also have a programmatic interface. In some embodiments, the user-selectable switches, discussed below with reference to FIG. 3, as well as other settings such as for the down-converter frequency or frequencies, may receive instructions from the instrument. The user may select the frequency range, switch settings, and other operating parameters through the user interface, and/or may provide control instructions for the accessory device 14 through a control interface. As will be discussed in more detail below, the instrument may control operation of the accessory device to achieve particular performance parameters for components of the instrument, and may designate performance parameters for the combination of the accessory device and the instrument as one system. The accessory device may pass calibration information to the instrument to allow the instrument to adjust for any error introduced by the accessory.

Figure 2:
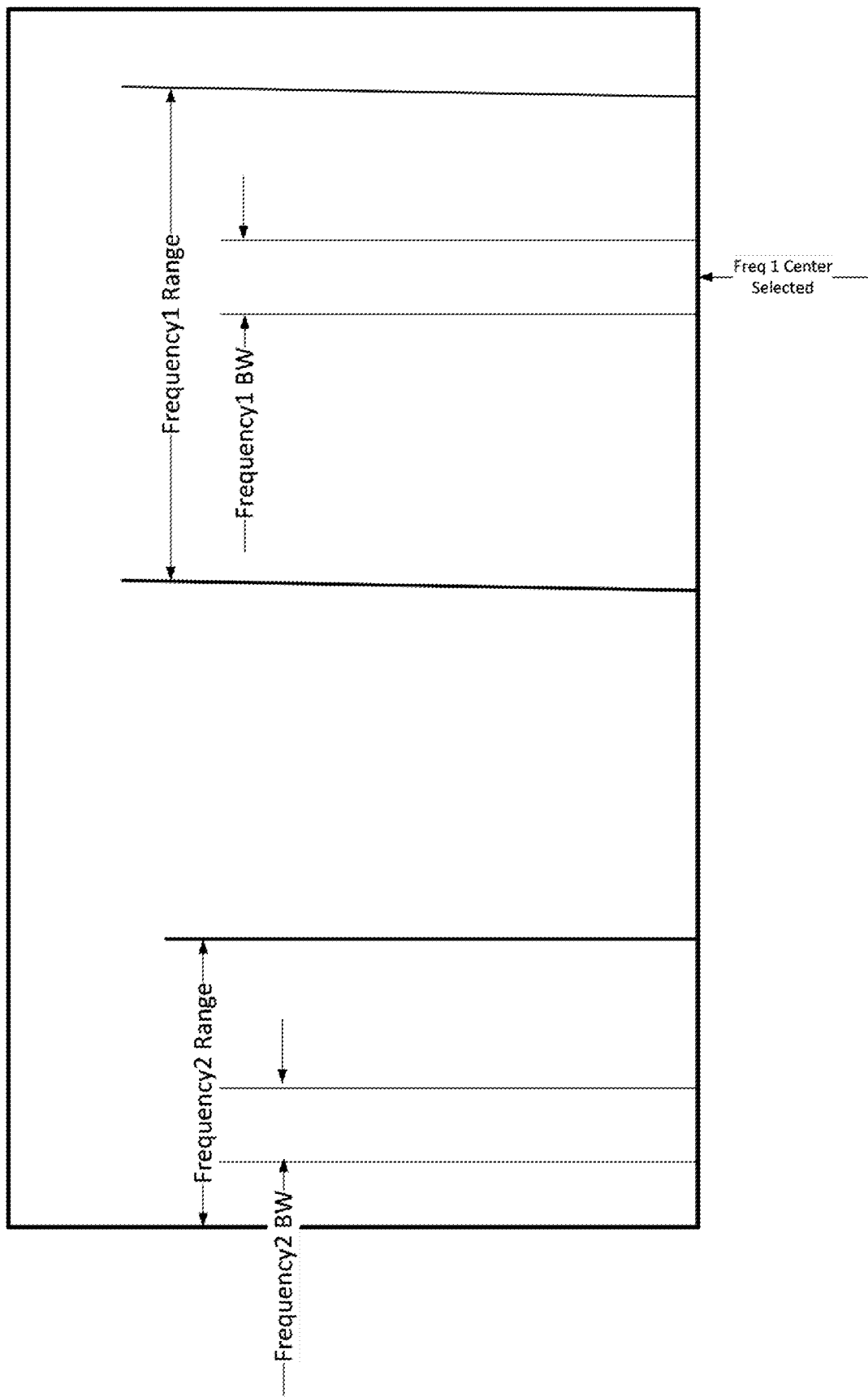
FIG. 2 shows a graphical representation of a frequency and bandwidth.

FIG. 2 shows a representation of the bandwidth and frequency when the accessory device 14 and the instrument 16 operate together. The instrument will have a wide operating bandwidth, such as from 500 MHz to 8 GHz. A user can select one of the configurable signal paths in the accessory device to select a first frequency, shown in FIG. 2 as the Freq 1 Center Selected. This is located in the Frequency1 Range and has a bandwidth of Frequency1 BW. Generally, the Frequency1 BW and the Frequency2 BW will be the same. By selecting one of the configurable signal paths in the accessory device, the user can convert the Frequency1 Range to the Frequency2 Range, where the Frequency2 Range is within the wide operating bandwidth of the instrument 16. The user can use the accessory device to position a second frequency center to optimize performance within the Frequency2 Range, where the parameters that may be optimized include EVM, distortion, image suppression, and spurious signals.

Figure 3:
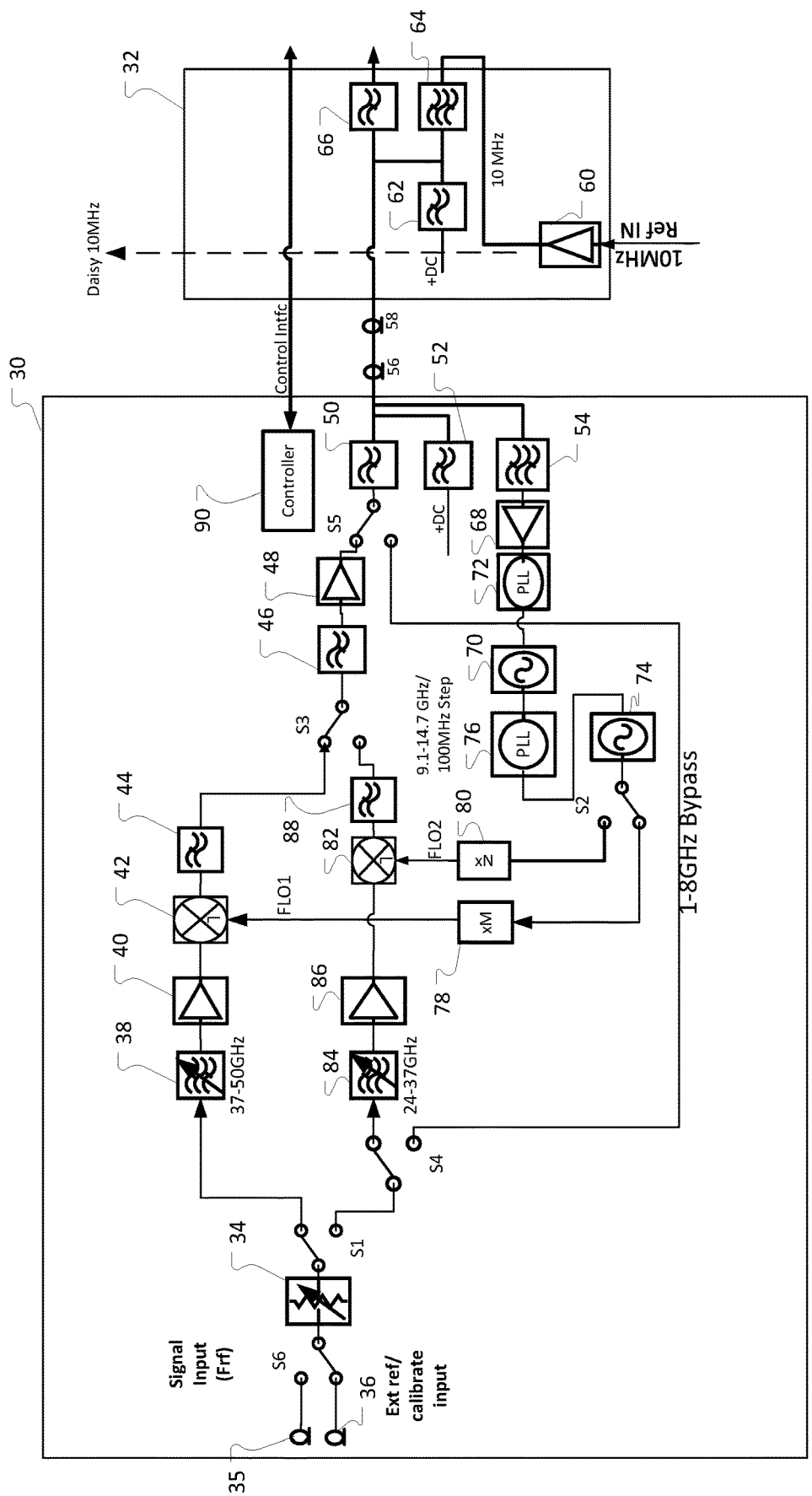
FIG. 3 shows a circuit diagram of a signal down-converter for a test and measurement device.

FIG. 3 shows an embodiment of an accessory device having multiple configurable signal paths including downconverters, such as 18, 20 from FIG. 1. One should note that the specifics of the circuit elements and the frequencies used here only provide examples and are not intended to limit the scope of the embodiments to these particulars, so no limitation should be inferred. The accessory device 14 may have a down-converter module 30 having multiple configurable down-conversion signal paths, and an interface module 32 that provides power-frequency reference distribution to the instrument.

The embodiment of the down-converter 30 may have three paths between the input from the device under test 12 and the output to the instrument 16. The accessory 14 may have multiple input ports, including a test port 35 that receives incoming signals from the DUT and a reference port 36 that may receive incoming signals from a calibration or reference source to allow the accessory module to undergo calibration. Switch S6 selects between the two inputs. The attenuator 34 may comprise many different types of controllable attenuators, include a voltage controlled attenuator, a current controlled attenuator, or a digital step attenuator.

With S6 set to receive an input from the DUT, the settings of the other switches determines through which path the incoming signal undergoes down-conversion. As shown here, at least two paths perform down-conversion with an additional path providing a bypass, shown from switch S4 to switch S5. The upper path starting with the variable filter 38 handles signals in this embodiment from 37-50 GHz. The variable filters used here may comprise one of many types of variable filters including voltage-controlled variable filters, current controlled variable filters, and digital step filters. The signal passes from the filter 38 to a buffer or Low Noise Amplifier (LNA) 40 and then a frequency mixer 42. In the embodiment of the buffer being an LNA, it may be fixed in the signal path, switched in and out of the signal path, and may be an adjustable gain LNA. The frequency mixer receives the filtered signal and a local oscillator signal FLO1. The mixer creates an output having a frequency range that is then low-pass or band-pass filtered at 44.

Switch S1 and S3 are selected in concert so that when S1 selects the upper path in the diagram, S3 will provide the output of the upper path to the high pass filter 46 and buffer 48. The filter 50 allows selection of which band of frequencies reach the output. The DC filter 52 provides a DC output. This allows the signals to all be sent on one cable between the accessory device and the instrument. Extra output ports 56 and 58 may allow other instruments to receive the down-converted signal, other than the instrument shown in FIG. 1. A 10 MHz reference signal, through buffer 60 and band pass filter 64, the DC signal through low pass filter 62 and the down converted signal through high pass filter 66 all travel though the same cable.

These filters on the power/frequency/signal distribution block all the DC bias and frequency reference to be provided to the down-converter from the signal distribution module, as well as allowing the converted signal from the down-converter, through the signal distribution module and onto the instrument. This allows multiple signals to be combined on a single cable, reducing weight and cost while also providing a simpler cabling interface for the user of the down-converter/instrument. In the absence of this filtering, the 10 MHz reference would be distributed to each down-converter by a coaxial cable, each down-converter would have a separate power cable, and each down-converter would have a separate output coaxial cable.

The 10 MHz reference is also provided to the band pass filter 54 which passes it through buffer 68 to PLL 72. The local oscillator 70 is under control of the PLL 72, and the local oscillator 74 is under control of the PLL 76. The output signals from these oscillators go through frequency multipliers 78 and 80 and provide input signals FLO1 and FLO2 to the mixers 42 and 82, respectively. The frequency multipliers 78 and 80 multiply an input frequency to produce an output frequency $f_{out}=f_{input}*N$ (or M), and include amplification and filtering to select the desired output frequency and output power level needed by the mixer. The frequency multipliers may be built as odd harmonic, x1, x3, x5, x7, etc., even harmonic, x2, x4, x6, comb generators, x1, x2, x3, x4 . . . xN, etc.

Returning to the left side of the diagram, the mixer 82 mixes the input signal from the middle signal path if switches S1 and S4 are set to provide the input signal along that path. The input signal passes through the variable filter 84 and buffer 86, and is mixed at mixer 82 with the signal FLO2. It then undergoes low-pass or band-pass filtering at filter 88 and then proceeds out the output path similar to the upper signal path described above, with the switch S3 set to select the middle path.

The switch settings, PLL controls, variable filters, variable attenuators and other controllable components used will receive their settings and/or control instructions from the controller 90 through the control interface signal from the instrument 16. The control interface may consist of a standard interface such as micro-USB, etc.

Figure 4:
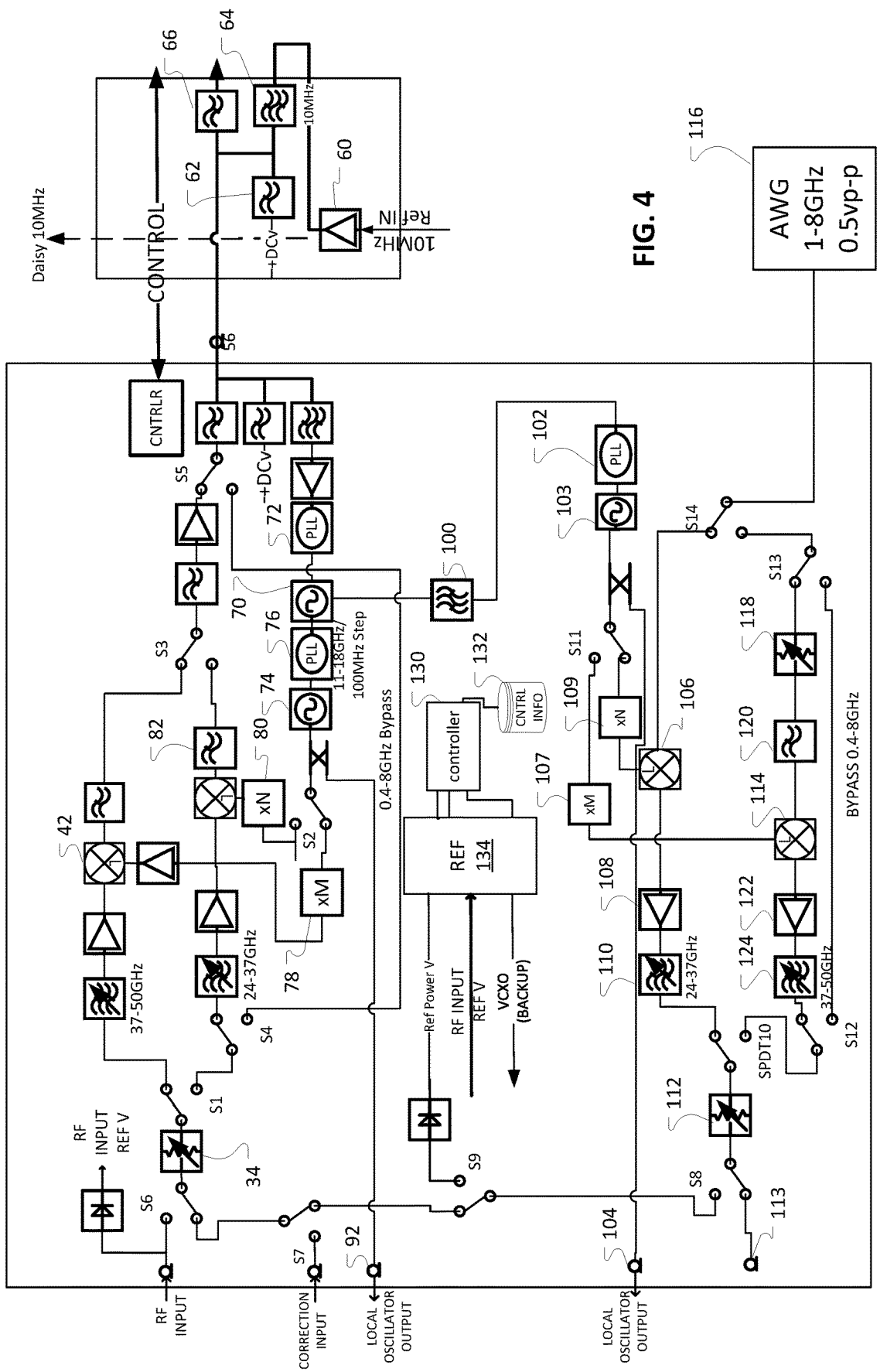
FIG. 4 shows a circuit diagram of a combined signal down-converter and a signal up-converter for a test and measurement device.

Referring back to FIG. 1, the accessory device 14 may have one or more down-converters 18, 20. Optionally, it may also include an up-converter that can receive inputs from the local oscillators and a waveform generator, on the instrument 16 or external to it, and provide a high frequency signal to the DUT. FIG. 4 shows an embodiment of a combination down-converter/up-converter accessory device.

The down-converter circuit at the top of the diagram is similar to the one of FIG. 3 with the addition of an up-converter. In the up-converter, the output of the oscillator 70 goes through a band pass filter 100 and into PLL 102. The output of the PLL 76 from the down-converter may be coupled to an output line through the local oscillator 74 to provide a local oscillator output 92, in either this circuit or in the down-converter of FIG. 3. Similarly, the output of the PLL 102 may be coupled to an output line through local oscillator 103 and provided as a second local oscillator output 104. As mentioned above, the accessory device may provide control of the instrument. The local oscillator(s) may be adjustable. Adjusting the oscillator may adjust performance of the test and measurement instruments, such as the performance parameters of one or more of the analog-to-digital converters in the test and measurement instrument. The oscillator may also generate an output signal.

The PLL 102 output, depending upon the state of the switch S11 will go through one of two up-conversion paths. As shown, the output goes through multiplier 109 to mixer 106 to produce a higher frequency signal when combined with an input from an Arbitrary Waveform Generator (AWG) 116 through S14. The output of the mixer undergoes buffering at buffer 108, filtering at variable filter 110, and attenuation at attenuator 112 to provide a 24-37 GHz output at a second test port output 113.

Alternatively, if switch S11 lies in the other position, the output of the PLL 102 goes through multiplier 107 and then into mixer 114. The AWG 116 provides the other input to the mixer 114. The AWG 116 may also have a bypass path shown determined by switches S14, S13, S12 and S10. The signal from the AWG 116 goes through the variable filter 118 and low pass filter 120 to reach the mixer 114. Buffer 122 buffers the output of the mixer, which then undergoes filtering at the variable filter 124. The variable attenuator 112 then attenuates this signal and provides it to output 113 depending upon the position of switch S8.

The up-converter may have a separate controller interface with controller 130 that receives the control information 132. The controller may also receive a reference power voltage from the reference input depending upon the states of the switches S6, S7 and S9. The reference block 134 may include a temperature monitoring circuit 134 to allow the controller to adjust for performance drift based upon temperature. In this manner an up-converter circuit can be added to the accessory device 14.

Figure 5:
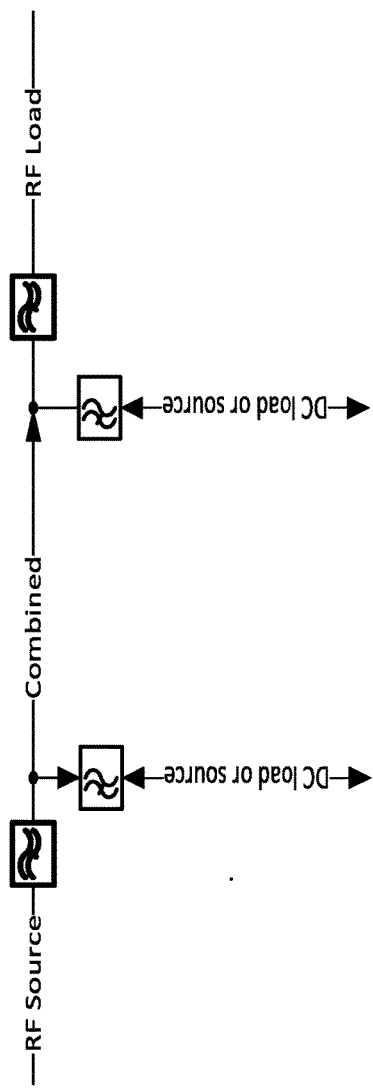
FIG. 5 shows a block diagram of a DC bias tee source and load.

A possible concern exists in signal management of the down-converter signals with the DC and reference signals. This may require a termination network, such as a bias tee. FIG. 5 shows an overview of a termination, with a more specific embodiment shown in FIG. 6. FIG. 5 shows the RF signals from the DUT 12 traveling to the RF load, in this case the instrument 16. The region between the two forms the combined signal region. In the combined region, the band from DC or 0 Hz signal to the low frequency, is reserved for the DC power signal. The low frequency is user-determinable, but may be, for example, 100 kHz. The band from whatever the low frequency is, in this example 100 kHz, to high RF, such as 10 GHz, is reserved for the DUT RF signal or IF signal after down-conversion. The RF or IF components travels from the DUT to the load, and the DC component travels from right to left.

Figure 6:
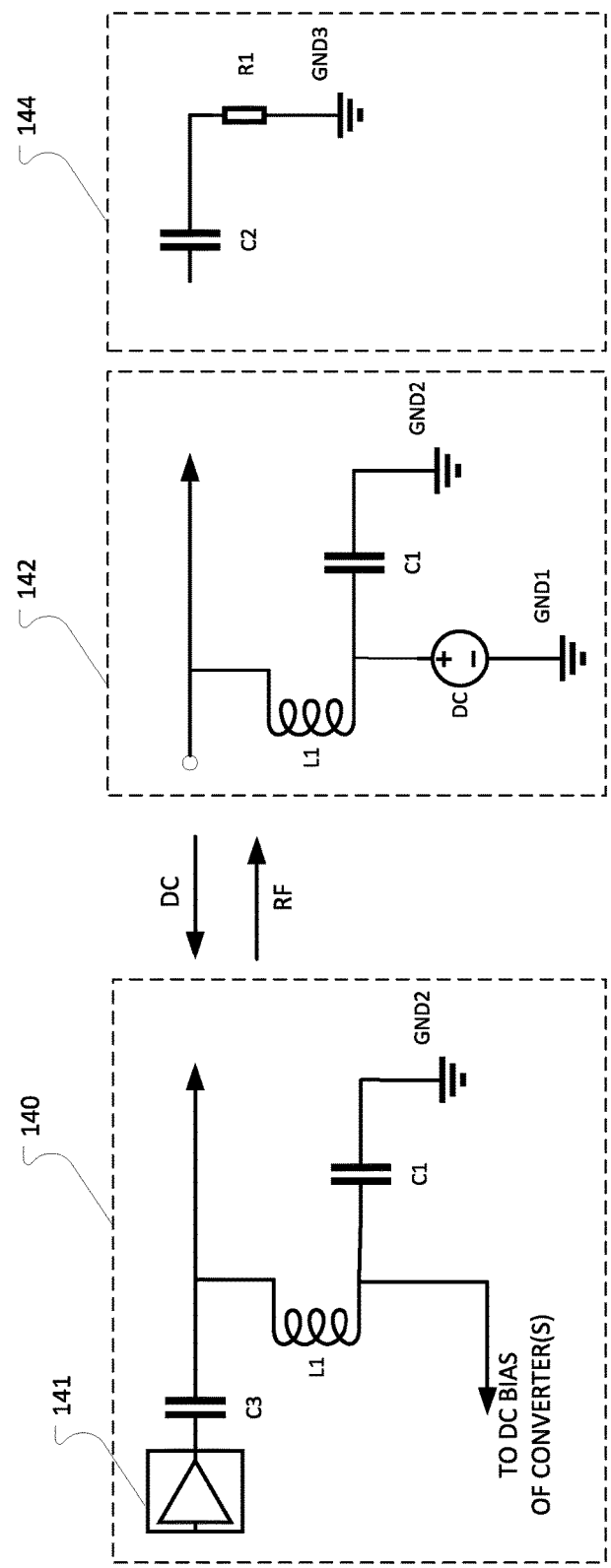
FIG. 6 shows an embodiment of a diplexer usable with an accessory for a test and measurement device.

FIG. 6 shows an embodiment of a diplexer. When the illustrated portions operate together, they ensure a good impedance match at all frequencies. The portion 140 is on the DUT, 142 is in the DC block of the accessory device, and 144 is in the down-converter or up-converter. The capacitor C3 is in series with the RF source 141 to keep the DC from disturbing this portion of the circuit. The DC is separated out by the inductor L1 or other low pass network. The capacitor in series with the RF and the inductor in series with the DC creates a high pass filter to the RF path and a low pass filter for the DC path. On the right, the capacitor C2 or other high pass filter prevents the DC from passing to the instrument signal input. The DC does not flow into the RF section of the down-converter or the instrument. The DC bias flows to the DC section of the down-converter or up-converter.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

EXAMPLES

Illustrative examples of the disclosed technologies are provided below. An embodiment of the technologies may include one or more, and any combination of, the examples described below.

Example 1 is an accessory device, comprising: a test port; an instrument port to connect to an instrument having an operating bandwidth; and one or more configurable signal paths connectable between the test port and the instrument port to convert a signal from the test port having a first frequency range to a signal having a second frequency range different than the first frequency range, wherein the second frequency range is within the operating bandwidth of the instrument.

Example 2 is the accessory device of Example 1, wherein one or more of the configurable signal paths include one or more user-selectable switches to select the first frequency range.

Example 3 is the accessory device of any of the Examples 1 and 2, wherein the operating bandwidth of the instrument is 5 GHz or greater.

Example 4 is the accessory device of any of the Examples 1 through 3, wherein at least one frequency of the first frequency range is at least twice the operating bandwidth of the instrument channel.

Example 5 is the accessory device of any of the Examples 1 through 4, wherein at least one of the one or more configurable signal paths includes a bypass path between the test port and the instrument port.

Example 6 is the accessory device of any of the Examples 1 through 5, further comprising at least one additional instrument port, at least one of the one or more configurable signal paths connectable between the test port and the additional instrument port.

Example 7 is the accessory device of any of the Examples 1 through 6, further comprising a calibration input port and a calibration signal path connectable between the calibration input port and the instrument port.

Example 8 is the accessory device of any of the Examples 1 through 7, further comprising a control interface to receive control instructions.

Example 9 is the accessory device of any of the Examples 1 through 8, wherein at least one of the one or more configurable signal paths comprises a down-converter to down-convert a signal from the test port having a first frequency range to a signal having a second frequency range lower than the first frequency range.

Example 10 is the accessory device of any of the Examples 1 through 9, further comprising an up-converter circuit connectable between the instrument port and a second test port, the up-converter circuit connected to a waveform generator.

Example 11 is the accessory device of Example 10, wherein the up-converter circuit has a switch that connects a waveform generator signal to the second test port in a first position and connects the waveform generator signal to a mixer with a signal from the instrument port in a second position.

Example 12 is a test and measurement system, comprising: a test and measurement instrument having an operating bandwidth; and an accessory device, comprising: a first instrument port to connect the accessory device to the test and measurement instrument; a test port to connect the accessory device to a device under test; and one or more configurable signal paths connectable between the test port and the instrument port, at least one of the one or more configurable signal paths including a down-converter to down-convert a signal from the test port having a first frequency range to a down-converted signal having a second frequency range lower than the first frequency range, wherein the second frequency range is within the operating bandwidth of the test and measurement instrument.

Example 13 is the test and measurement system of Example 12 wherein the accessory device includes at least one of a variable attenuator and a variable preamplifier controlled by the test and measurement instrument.

Example 14 is the test and measurement system of either of Examples 13 and 14, wherein the accessory device is one of attached to the test and measurement instrument, or connects to the test and measurement instrument by a cable and the accessory device connects to an input end of the cable.

Example 15 is the test and measurement system of any of the Examples 12 through 14, the accessory device further comprising a second down converter to send a second lower frequency signal to a second instrument port, the second lower frequency signal having a frequency lower than the first frequency and different from the frequency of the first lower frequency signal, the second instrument port to connect to a different channel in the test and measurement instrument than the first instrument port.

Example 16 is the test and measurement system of any of the Examples 12 through 15, the accessory device further comprising a second down-converter to send a second lower frequency signal to a second instrument port, the second lower frequency signal having a frequency lower than the first frequency and different from the frequency of the first lower frequency signal, the second instrument port to connect to a different channel in the test and measurement instrument than the first instrument port.

Example 17 is the test and measurement system of any of the Examples 12 through 16, wherein a user interface on the test and measurement instrument receives settings for the accessory device.

Example 18 is the test and measurement system of any of the Examples 12 through 19, wherein the accessory device receives power from the test and measurement instrument.

Example 19 is the test and measurement system of any of the Examples 12 through 18, further comprising a local oscillator.

Example 20 is the test and measurement system of Example 19, wherein the local oscillator is adjustable.

Example 21 is the test and measurement system of Example 19, wherein an adjustment made to the local oscillator adjusts a performance parameter of an analog-to-digital converter in the test and measurement instrument.

Example 22 is the test and measurement system of any Example 19, further comprising a local oscillator port configured to output a signal from the local oscillator.

Example 23 is the test and measurement system of any of the Examples 12 through 22, further comprising a termination network for a device under test.

Example 24 is the test and measurement system of any of the Examples 12 through 23, the accessory device further comprising a power meter configured to measure RF power of the signal from the test port and the RF power of the down-converted signal.

Example 25 is the test and measurement system of any of the Examples 12 through 24, wherein the instrument controls the accessory to achieve predetermined performance parameters for the system.

Example 26 is the test and measurement system of any of the Examples 12 through 25, wherein the accessory device is configured to pass calibration information to the instrument.

Example 27 is the test and measurement system of any of the Examples 12 through 26, wherein the test and measurement instrument is one of an oscilloscope or a wideband digitizer.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. An accessory device, comprising:
a test port to connect the accessory device to a device under test;
an instrument port to connect to an instrument channel of a test and measurement device having an operating bandwidth, the accessory device arranged between the DUT and the test and measurement device; and
one or more configurable signal paths connectable between the test port and the instrument port to down convert an RF input signal received from a device under test at the test port having a first frequency range to a down converted output signal having a second frequency range lower than the first, the one or more configurable signal paths to output the down converted output signal having the second frequency range to the instrument port, the second lower frequency range based upon a frequency range of the test and measurement device.

2. The accessory device as claimed in claim 1, wherein one or more of the configurable signal paths include one or more user-selectable switches to select the operable range of the first frequency.

3. The accessory device as claimed in claim 1, wherein the operating bandwidth of the instrument is 5 GHz or greater.

4. The accessory device as claimed in claim 1, wherein the first frequency is at least twice the operating bandwidth of the instrument channel.

5. The accessory device as claimed in claim 1, wherein at least one of the one or more configurable signal paths includes a bypass path between the test port and the instrument port.

6. The accessory device as claimed in claim 1, further comprising at least one additional instrument port having the operating bandwidth, at least one of the one or more configurable signal paths connectable between the test port and the additional instrument port.

7. The accessory device as claimed in claim 1, further comprising a calibration input port and a calibration signal path connectable between the test port and the instrument port.

8. The accessory device as claimed in claim 1, further comprising a control interface to receive control instructions.

9. The accessory device as claimed in claim 1, wherein at least one of the one or more configurable signal paths comprises a down-converter to down-convert an input signal from the test port having a first frequency range to an output signal having a second frequency range lower than the first frequency range.

10. The accessory device as claimed in claim 1, further comprising an up converter circuit connectable between the instrument port and a second test port, the up converter circuit connected to a waveform generator.

11. A test and measurement system, comprising:
a test and measurement instrument having at least one communication channel with an operating bandwidth, and a user interface; and
an accessory device arranged between the test and measurement instrument and a device under test, comprising:
a first instrument port to connect the accessory device to the test and measurement instrument;
a test port to connect the accessory device to the device under test; and
one or more configurable signal paths connectable between the test port and the instrument port to down convert an RF input signal from the test port having a first frequency range to a down converted output signal having a band of frequencies in a second frequency range lower than the first frequency range, the one or more configurable signal paths are to be configured based upon the first frequency range, the one or more configurable signal paths to output the down converted output signal to the instrument port, the second lower frequency range of the down-converted signal based upon a frequency range of the test and measurement instrument.

12. The test and measurement system as claimed in claim 11 wherein the accessory device includes at least one of a variable attenuator and a variable preamplifier controlled by the test and measurement instrument.

13. The test and measurement system as claimed in claim 11, wherein the accessory device is one of attached to the test and measurement instrument, or connects to the test and measurement instrument by a cable and the accessory device connects to an input end of the cable.

14. The test and measurement system as claimed in claim 11, wherein the accessory device is housed in a test and measurement probe.

15. The test and measurement system as claimed in claim 11, the accessory device further comprising a second down converter to send a second lower frequency output signal to a second instrument port, the second lower frequency output signal having a frequency lower than the first frequency and different from the frequency of the first lower frequency signal, the second instrument port to connect to a different channel in the test and measurement instrument than the first instrument port.

16. The test and measurement system as claimed in claim 11, wherein a user interface on the test and measurement instrument receives settings for the accessory device.

17. The test and measurement system as claimed in claim 11, wherein the accessory device receives power from the test and measurement instrument.

18. The test and measurement system as claimed in claim 11, further comprising a local oscillator.

19. The test and measurement system as claimed in claim 18, wherein the local oscillator is adjustable.

20. The test and measurement system as claimed in claim 18, wherein adjustments made to the local oscillator adjusts performance parameters of an analog to digital converter in the test and measurement instrument.

21. The text and measurement system as claimed in claim 18, further comprising a local oscillator port configured to output a signal from the local oscillator.

22. The test and measurement system as claimed in claim 11, further comprising a termination network for a device under test.

23. The test and measurement system as claimed in claim 11, the accessory device further comprising a power meter configured to measure RF power of the signal from the test port and the RF power of the second signal.

24. The test and measurement system as claimed in claim 11, wherein the instrument controls the accessory to achieve predetermined performance parameters for the system.

25. The test and measurement system as claimed in claim 11, wherein the accessory device is configured to pass calibration information to the instrument.

26. The test and measurement system as claimed in claim 11, wherein the accessory device is one of an oscilloscope or a wideband digitizer.

27. An accessory device, comprising:
a test port;
an instrument port to connect to an instrument channel having an operating bandwidth;
one or more configurable signal paths connectable between the test port and the instrument port to down convert a signal from the test port having a first frequency range to a signal having a second frequency range lower than the first frequency; and
an up-converter circuit connectable between the instrument port and a second test port, the up-converter circuit having a switch that connects a waveform generator signal to the second test port in a first position and connects the waveform generator signal to mixer with a signal from the instrument port in a second position.

* * * * *